United States Patent [19]
Gazit et al.

[11] Patent Number: 5,219,640
[45] Date of Patent: Jun. 15, 1993

[54] FLEXIBLE CIRCUIT HAVING FLEXING SECTION OF REDUCED STIFFNESS, AND METHOD OF MANUFACTURE THEREOF

[75] Inventors: Samuel Gazit, West Hartford; Richard T. Traskos, Brooklyn, both of Conn.; Leonard S. Calabrese, Phoenix; Michael J. Taylor, Chandler, both of Ariz.; Jeffrey B. Otto, Brooklyn; Brett W. Kilhenny, Storrs, both of Conn.

[73] Assignee: Rogers Corporation, Rogers, Conn.

[21] Appl. No.: 756,993

[22] Filed: Sep. 11, 1991

Related U.S. Application Data

[63] Continuation-in-part of Ser. No. 652,321, Feb. 8, 1991, abandoned.

[51] Int. Cl.⁵ .............................................. B32B 9/00
[52] U.S. Cl. .................................... 428/209; 428/901; 428/457; 361/398; 174/250
[58] Field of Search .................. 428/209, 457, 901; 361/398; 174/250

[56] References Cited

U.S. PATENT DOCUMENTS

| | | | |
|---|---|---|---|
| 4,812,213 | 3/1989 | Barton et al. | 204/15 |
| 4,945,029 | 7/1990 | Bronnenberg | 430/316 |

*Primary Examiner*—Patrick J. Ryan
*Assistant Examiner*—Cathy K. Lee
*Attorney, Agent, or Firm*—Fishman, Dionne & Cantor

[57] ABSTRACT

A flexible circuit is presented having a flexing (cyclic bending) section of lower stiffness than adjacent parts of the circuit. The lower stiffness in the flexing section is achieved by reducing the thickness of the flexing section, either by omitting or removing some or all of the dielectric material of the flexible circuit in the flexing section, or by replacing conventional dielectric material in the flexing section with a polymer of lower modulus of elasticity.

45 Claims, 6 Drawing Sheets

FLEXIBLE CIRCUIT HAVING FLEXING SECTION OF REDUCED STIFFNESS, AND METHOD OF MANUFACTURE THEREOF

CROSS-REFERENCE TO RELATED APPLICATION

This is a continuation-in-part of U.S. patent application Ser. No. 652,321 filed Feb. 8, 1991, now abandoned.

BACKGROUND OF THE INVENTION

This invention relates to the field of flexible circuits. More particularly, this invention relates to the field of flexible circuits in which an area of the circuit is subjected to repeated flexing to accommodate the movement of a component to which the flexible circuit is connected. As used herein, the term "flexing" refers to cyclic bending of a predetermined portion of the flexible circuit.

The field of computer disc drives is one to which this invention is particularly pertinent, so that field will be discussed for purposes of illustration of the features, utility and advantages of this invention. However, it is to be understood that this invention is not limited to circuits for disc drives; rather, this invention is generally suitable for any application in which it is desired to facilitate flexing of a flexible circuit.

In computer disc drives the read/write head scans the disc, i.e., moves over the surface of the memory disc, to perform its read/write function. A flexible circuit connects the read/write head to the computer system for signal transmission between the disc and the computer. The flexible circuit flexes, generally in what is referred to as a "rolling" or "roll flexing" mode, to accommodate and permit linear movement of the read/write head in a radial direction with respect to the memory disc. A certain amount of energy is, of course, required to flex the flexible circuits. The flexing action of a flexible circuit can be viewed and analyzed as analogous to cyclic beam bending, and the amount of energy consumed to effect flexing is a direct function of the stiffness of the flexible circuit in the area where the bending occurs. As disc drive technology has evolved, disc diameter has gotten progressively smaller, going from 8" to 5¼ to 3½, and now looking to about 2" for the next generation of disc drives. This has led to a reduction in the length (and generally the overall size) of the flexible circuit and a reduction in the section of the flexible circuit that is subjected to dynamic flexing, and hence an increase or concentration of stress in that flexing section. Also, for newer disc drive applications it appears that designers are favoring what is referred to as the "book binding" approach rather than the traditional "roll flexing" in the design of the bending mode of the flexible circuit. This "book binding" approach results in a more compact circuit design with a shorter segment of the circuit which is subjected to the flexing action, thus further concentrating the area of stress.

A further related factor to be considered is that as computer systems become smaller and/or portable (e.g., lap top), it becomes increasingly important to reduce the amount of energy required to flex the flexible circuit to conserve the battery.

Other factors to be considered are the mass of the flexible circuit and the mechanical resistance to change in direction of movement of the head, i.e., inertia, imposed on the system by the stiffness of the flexible circuit. These factors affect the problem of overshoot and "ringing" or "hunting" in positioning the head at the desired location over the disc, and thus these factors relate to access time. Access time is particularly important in that in some cases access time determines the overall time necessary to complete an application.

Thus, there is a need for a flexible circuit that reduces the amount of energy required to effect flexing, accommodates flexing in a small segment of the circuit, and reduces overshoot and ringing to reduce access time.

SUMMARY OF THE INVENTION

The present invention addresses and alleviates the above discussed problems. In accordance with the present invention, a flexible circuit is provided with a discrete flexing section in which the bending moment is reduced by reducing the stiffness of the circuit in the flexing section. This reduction in stiffness is achieved by reducing the moment of inertia of the flexing section, or by reducing the modulus of elasticity of the insulating material in the flexing section. Reduction of the moment of inertia is preferably achieved by eliminating from the bending section some or all of the insulating material which usually forms the upper and lower layers of the flexible circuit. This reduces the moment of inertia and the stiffness in the flexing section, and hence reduces the moment or force (and hence the energy) required to effect flexing of the circuit.

The insulation may be removed in a variety of ways. Preferably, insulation removal is effected by laser ablation after the circuit has been formed with the insulation initially in place, or by punching windows in the insulation in the bending section prior to laminating the insulation to the flexible circuitry.

In one embodiment of the invention the outer insulation is removed entirely in the flexing section leaving only adhesive around the conductors. In another embodiment, the outer insulation is removed in the flexing section except for thin border or edge strips which are left to protect the edge construction of the laminate flexible circuit. Alternatively, the insulation in the flexing section can be thinned (from the initially thicker construction of the overall flexible circuit) to remove most, but not all, of the insulation in the flexing section. The thinning can be achieved by laser ablation or by other means, such as chemical etching, plasma burning, or mechanical removal (e.g., grinding, fly cutting, milling).

In another embodiment, the insulating material in the flexing section is a material of lower modulus of elasticity than the insulating material in the remainder of the flexible circuit, thereby reducing the stiffness of the flexing section.

In still another embodiment, one or a series of deep, narrow channels are provided in the outer dielectric to create a "polymer hinge" and thereby achieve an area of increased flexibility. This "hinged" area may be created at a relatively low cost by use of laser (UV excimer) ablation techniques. In yet another embodiment, the channels are shaped in an elongated or flattened configuration to avoid an abrupt increase in stress on the circuit during flexing.

Yet another embodiment of this invention provides areas of reduced stiffness or flexing sections to well known adhesiveless circuit materials.

The reduction in stiffness of the flexing section of the flexible circuit translates into a reduction in the energy required to effect flexing of the flexible circuit during movement of the disc drive read/write head. The reduced stiffness of the flexing section and the reduced mass thereof also reduces a source of resistance to movement of the read/write head, thus reducing overshoot and ringing, eliminating or reducing a potential source of time delay in head movement and improving access time.

The above discussed and other features and advantages of the present invention will be apparent to and understood by those skilled in the art from the following details description and drawing:

BRIEF DESCRIPTION OF THE DRAWINGS

Referring to the drawings, wherein like elements are numbered alike in the several FIGURES.

DESCRIPTION OF THE PREFERRED EMBODIMENT

Figure 1:
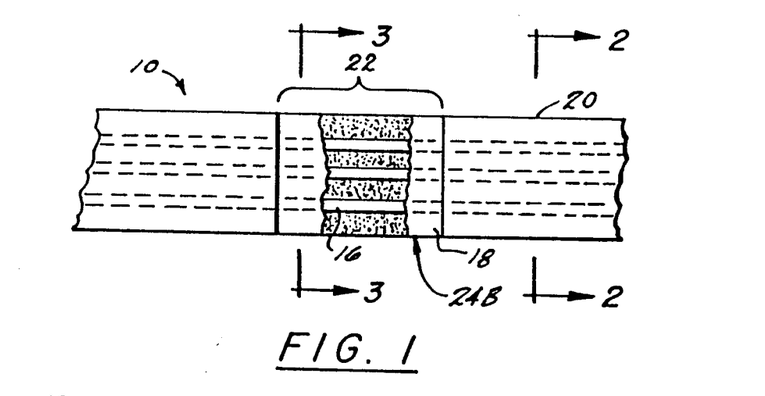
FIG. 1 is a top plan view of a part of a flexible circuit in accordance with the first embodiment of the present invention.
Figure 2:
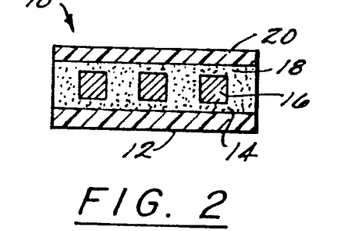
FIG. 2 is a sectional elevation view taken along line 2-2 of FIG. 1.
Figure 3:
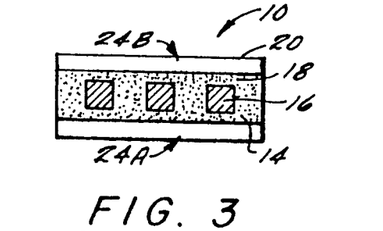
FIG. 3 is a sectional elevation view taken along line 3-3 of FIG. 1.

Referring to FIGS. 1-3, a first embodiment of the flexible circuit of the present invention is shown. It will, of course, be understood that the circuit depicted here is representative or symbolic for illustrative purposes only. Flexible circuit 10 is a laminate structure composed throughout most of its length of a first or bottom layer 12 of dielectric material, preferably polyimide material, a first or bottom layer of adhesive, a layer of copper circuit lines 16 (which are typically formed by etching a continuous layer of copper originally bonded to bottom polyimide layer 12 by adhesive 14), a second or upper layer of adhesive 18, and a second or upper layer of polyimide 20 bonded to adhesive 18. During the manufacturing process, adhesive layers 14 and 18 flow under heat and pressure to fill the spaces between the copper circuit lines 16. By way of example, the polyimide material may be duPont Kapton material or Allied Apical material or ICI Upilex material, and the adhesive may be thermoplastic or thermosetting material. Rogers Corporation 8970 adhesive is an example of one such thermosetting adhesive.

A span 22 of the flexible circuit is designed to be the designated flexing section, and this designated flexing section is constructed differently then the remainder of the flexible circuit. Specifically, and as shown in FIG. 3, the polyimide layers 12 and 20 are removed or omitted from this designated flexing section, whereby the designated flexing section is composed only of bottom adhesive layer 14, circuit lines 16, and upper adhesive layer 18. The removal or omission of the polyimide layers 12 and 20 in the designated flexing section significantly reduces the moment of inertia of the designated flexing section relative to the rest of the flexible circuit, whereby the designated flexing section is significantly less stiff, or more flexible, than the remainder of the flexible circuit. For purposes of illustration, the flexing sections in FIG. 1 is shown with adhesive layer 18 partly broken away to show the circuit lines 16 and the adhesive therebetween.

Omission of the polyimide layers 12 and 20 can be effected by punching windows 24A and 24B, respectively, in those polyimide layers before those layers are incorporated in the laminate. In that regard, those skilled in the art will understand that the laminate from which the circuits are formed is typically made in a continuous roll process or in panel form, and the finished circuits are surrounded by excess laminate material before being singulated as by die punching. So, the windows can be punched in the polyimide layers without severing the rolls of polyimide material; and the windows in the top and bottom polyimide layers are properly positioned and aligned to be located at the desired designated flexing sections in the process of manufacturing the flexible circuits. It will be noted that omission of the polyimide layers 12 and 20 still leaves the adhesive layers 14 and 18 to provide electrical insulation and mechanical protection for the circuit lines 16.

Figure 4:
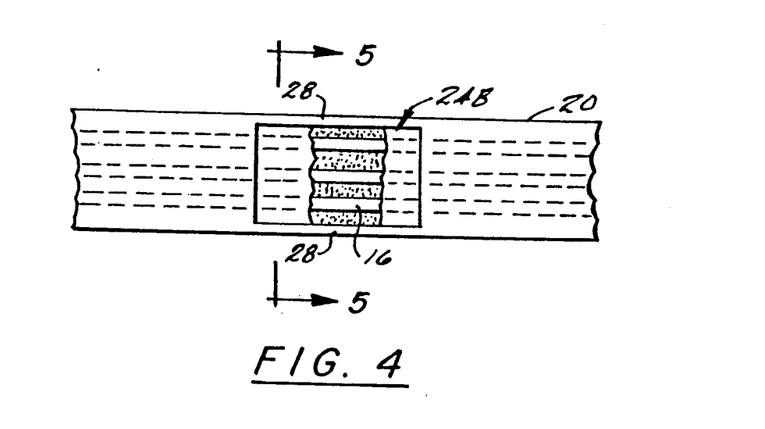
FIG. 4 is a top plan view of part of a flexible circuit in accordance with a second embodiment of the present invention.
Figure 5:
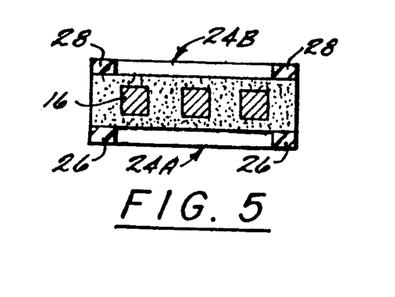
FIG. 5 is a sectional elevation view taken along line 5—5 of FIG. 4.

Referring to FIGS. 4 and 5, a second embodiment of the present invention is shown. This second embodiment differs from the first embodiment of FIGS. 1-3 only in that the windows 24A and 24B have narrow edge or side strips 26, 28 on the bottom and upper surfaces, respectively, of the flexible circuit. These edge strips are continuations of the polyimide layers 12 and 20. The presence of the narrow edge strips 26 and 28 have only a small effect on the stiffness in the designated flexing section (i.e., the stiffness in the designated flexing section is only slightly increased by the presence of the edge strips relative to a window without the edge strips), but significant advantages may be realized in protecting the edges of the adhesive and otherwise providing protection for the circuit in the mechanically sensitive designated flexing section.

The embodiments discussed with respect to FIGS. 1-5 have involved configurations where the polyimide layers are totally omitted (FIGS. 1-3) or mostly omitted (FIGS. 4 and 5) in the designated flexing section. In addition to omission of the polyimide layers, removal of the polyimide layers can be effected by any one of several means. The preferred method is by laser ablation with an excimer laser which is operated at a wavelength specific to the polyimide material and which can remove the polyimide material to a carefully controlled depth. If laser ablation is to be used for removal of the polyimide in the designated flexing section, the entire flexible circuit will initially be manufactured in the cross-section of FIG. 2. Then, laser ablation will be employed to remove some or all of the polyimide layers 12 and 20 in the designated flexing section to result in the construction of either FIGS. 1, 3 or FIGS. 4, 5.

Figure 6:
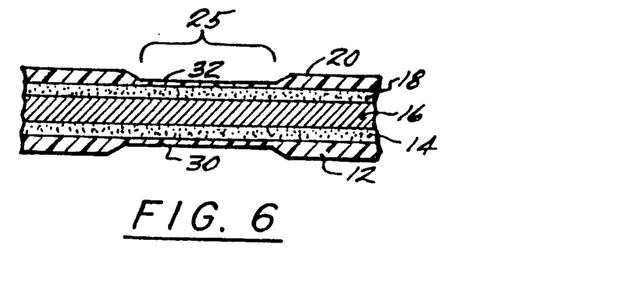
FIG. 6 is a side sectional elevation view of a part of a flexible circuit in accordance with another embodiment of the present invention taken along the line 6—6 of FIG. 12.

Instead of removing all of the polyimide layers 12 and 20 in the designated flexing section, laser ablation can be used to "thin" the polyimide layers in the designated flexing section if it is desired to leave some of the polyimide material in the designated flexing section. Some designers may prefer to do this, i.e., leave some of the polyimide material in the designated flexing section to provide some additional insulation and protection for the circuit lines. FIG. 6 shows a side sectional elevation view of a flexible circuit with a thinned designated flexing section 25 in which thinned portions 30, 32 of the polyimide layers 12, 20 overlie the circuit lines.

Partial or full removal of the polyimide layers in the designated flexing section (after initial construction of the flexible circuit with full bottom and upper polyimide layers) can also be effected by other techniques such as: chemical etching to selectively remove some or all of the upper and lower polyimide layers in the designated flexing section by use of known chemicals that will etch the polyimide but not affect the adhesive layers; plasma etching to remove the polyimide; or mechanical techniques such as grinding, fly cutting, milling, etc.

Regardless of whether the polyimide layers are fully or partly omitted or fully or partly removed in the designated flexing section, and regardless of the technique employed to effect omission or removal, symmetry should be established and maintained about the center line of the copper circuit lines in the designated flexing section to maximize the flex life of the designated flexing section. The designated flexing section can be analogized to and analyzed as a beam. Symmetry can be achieved geometrically and/or by selection of materials. Therefore, the copper leads should be centered as close as possible to the neutral axis of that beam structure, and it is preferred that there be symmetry from top to bottom and along the length and width of the flexible circuit in the designated flexing section.

As a further modification of the embodiments of FIGS. 1-5, the adhesive in the designated flexing section (i.e., within the window 24A, 24B) could also be totally removed from the top and bottom and between the lead lines, as by excimer laser ablation, and the adhesive could then be replaced by a very low modulus material, such as a low glass transition temperature elastomer, e.g., silicone rubber. This low modulus material would insulate and protect the circuit lines while being more flexible than the adhesive material.

Figure 8:
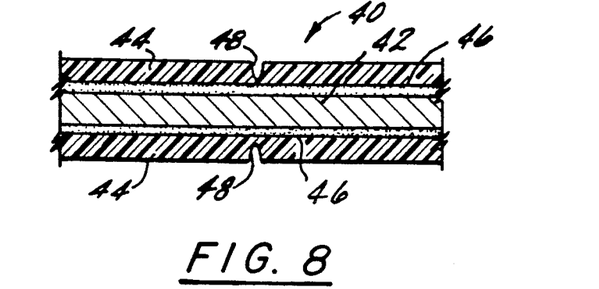
FIGS. 8-11 are side sectional views of still other embodiments of the present invention.

Referring now to FIG. 8, still another embodiment of the present invention is shown generally at 40. As described in conjunction with the circuits of FIGS. 1-5, circuit 40 comprises one or more circuit traces 42 sandwiched between a pair of outer insulative films 44 and bonded to films 44 by adhesive layers 46. The circuit of FIG. 8 has been provided with areas of low stiffness (increased flexibility) at low cost by removal of part of the dielectric film 44 with, for example, a laser (UV excimer laser) so as to create a pair of opposed deep narrow channels 48 (which, for example, may have a "U" or "V" shaped cross-sectional). The two channels 48 are disposed in alignment with each other and result in a "polymer hinge". This hinge provides enhanced flexibility to circuit 40 with relatively little additional cost for material removal.

Figure 9:
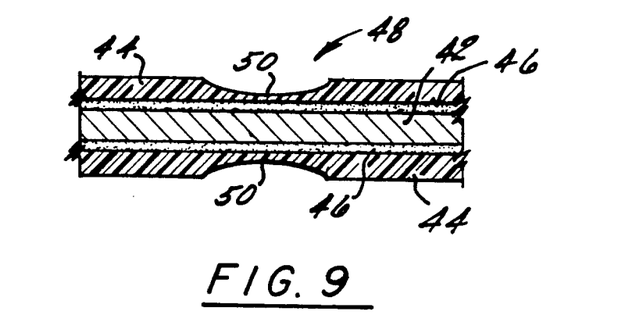
Figure 10:
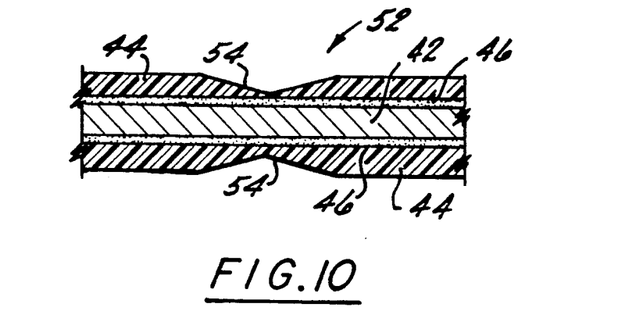

FIGS. 9 and 10 depict additional configurations which, like the FIG. 8 embodiment, are well suited for use with a laser (particularly a UV excimer laser) for removal of the outer dielectric material in order to provide areas of low stiffness. In FIG. 9, the dielectric material 44 in a circuit 48 has been removed to form a recess 50 having a flattened or elongated "U" shape cross-section. Note that the rounded corners of each recess 50 will provide reduced stress on circuit 48 relative to the sharper corners in thinned portions 30, 32 of the FIG. 6 embodiment. It will be appreciated that such sharp corners may result in undesirably abrupt increases in stress during flexing. A similar reduction in stress is achieved with the circuit 52 of FIG. 10. Utilizing an appropriate dielectric removal technique (which is preferably ablation by UV excimer laser), an opposed pair of elongated or flattened "V" shaped grooves 54 provide an area of reduced stiffness as well as reduced stress during flexing.

Figure 11:
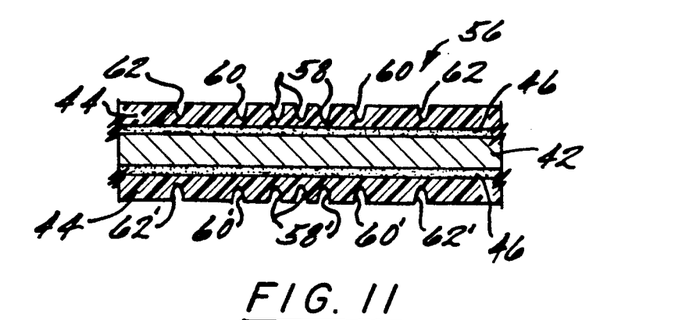

Still another embodiment of the present invention is depicted in the circuit 56 of FIG. 11. In circuit 56, a plurality of symmetrically spaced grooves 58, 58', 60, 60' and 62, 62'are provided at variable spacings. Thus, for example, each dielectric layer 44 includes three grooves 58, 58' equally spaced from one another at a first spacing; two grooves 60, 60' equally spaced from each other at a second spacing; and two grooves 62, 62' equally spaced from each other at a third spacing. The grooves may be of the type and configuration shown at 46, 46' in FIG. 8. The variably and symmetrically spaced grooves 58, 60 and 62 reduce the stresses imposed on the circuit during flexing so as to uniformly stress the circuit.

As discussed, the flexible circuits of the present invention having areas of low stiffness are particularly well suited for use as disc drive circuits where there is a significant requirement for flexible circuitry having areas of increased flexibility. An example of a flexible circuit for use in a disc drive application (which incorporates an area of low stiffness (increased flexibility)) in accordance with the present invention is shown at 64 in FIG. 12. Flex circuit 64 includes an area 66 constructed of thinner materials (of the type shown in FIG. 6) to provide flexibility. Of course, area 66 may be configured to conform to any of the other embodiments of this invention such as depicted in FIGS. 1, 4 or 8-11. In addition, circuit 64 includes end terminations 68 and 70 at each opposed end. Terminations 68 are adapted for connection to the read/write head while terminations 70 are adopted for connection to computer systems associated with the disc drive.

Figure 12:
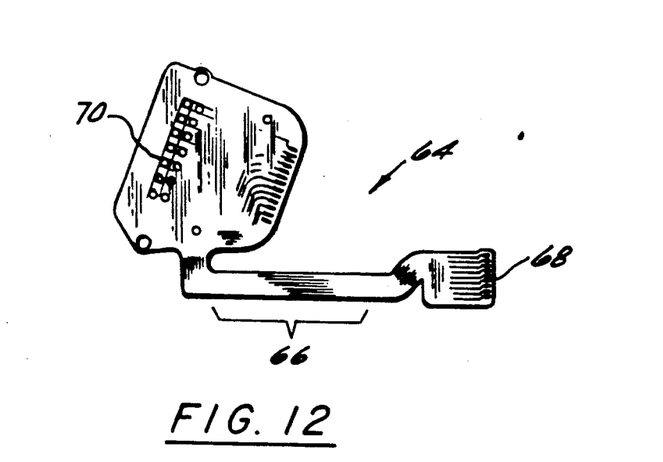
FIG. 12 is a top plan view of a flexible circuit in accordance with the present invention which is used in a disc drive application.
Figure 13:
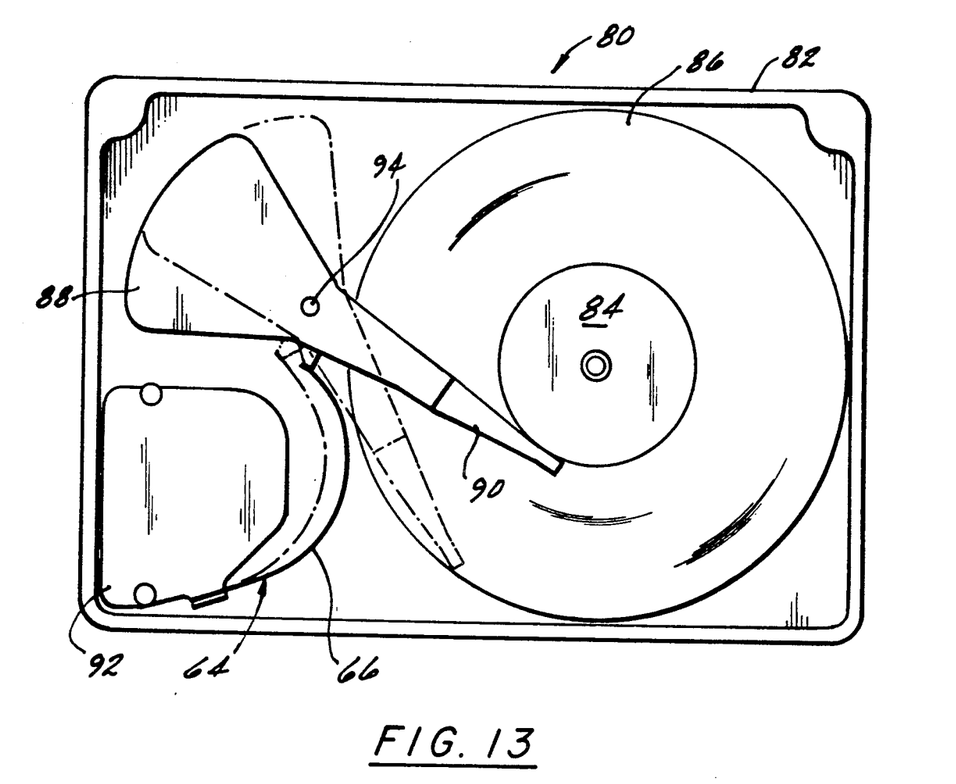
FIG. 13 is a top plan view of a disc drive unit which incorporates the disc drive circuit of FIG. 12.

A typical disc drive unit which may use circuit 64 of FIG. 12 is shown generally at 80 in FIG. 13. As is well known, disc drive unit 80 comprises an enclosure 82 for housing a rotary disc support mechanism 84 (having a memory disc 86 mounted thereon, a radially movable arm 88 which terminates at a read/write head 90, and a logic unit 92 which communicates with other components in an associated computer. Arm 88 pivots about pivot 94 between two extremes, namely a first position (shown in the solid lines) and a second position (shown in the phantom lines). As a result, read/write head 90 may be disposed over the entire disc 86.

Flexible disc drive circuit 64 is electrically and mechanically connected between arm 94 and logic unit 92 and thereby acts as the signal transmission means between the read/write head 90 and the logic unit 92. It will be appreciated that as arm 88 pivots and radially moves between the two extreme first and second positions, flexible circuit 64 will similarly move or flex between a first position (shown in solid line) and a second position (shown in phantom lines). Circuit 64 is therefore positioned so that area 66 of increased flexibility is subjected to the greatest degree of flexing (during movement of arm 88). As a result of the provision of area 66, the stiffness of flexible circuit 64 is greatly reduced in the flexing section as will be shown in the following analysis.

In practice, the flexing of a flexible circuit can be viewed and analyzed as equivalent to a beam in bending. Thus, the moment required to bend or flex the circuit in the designated flexing section is proportional to the cube of the thickness of the designated flexing section and directly proportional to the elastic modulus of the material in the designated flexing section, as shown from the relationship $$M = EI/r$$

where:
M = the moment required to bend the circuit (beam)
I = moment of inertia of the cross-section of the circuit
E = elastic modulus of the circuit material
r = radius of curvature of the designated flexing section For a rectangular cross-section (which is the case in the designated flexing section of the circuit), the moment of inertia is:

$$I = bh^3/12$$

where:
b = width of the circuit
h = height or thickness of the circuit

These relationships are employed in the comparative analysis of FIGS. 7(a)-7(e) and to generate the results shown in Table 1.

Figure 7A:
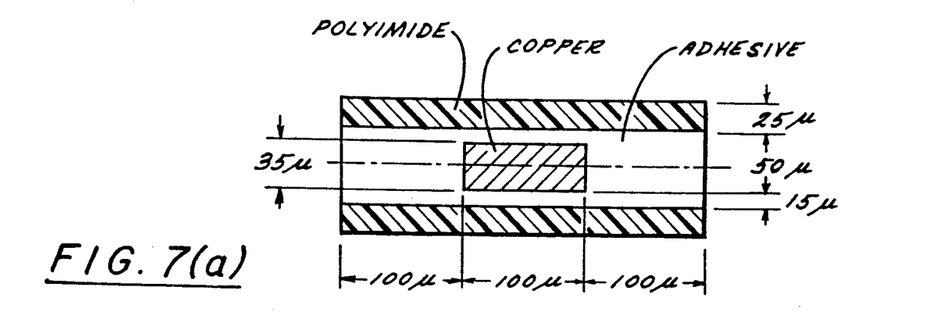
FIGS. 7(a)-7(e) show unit circuits of a control and constructions according to the several embodiments of this invention for comparison purposes.
Figure 7B:
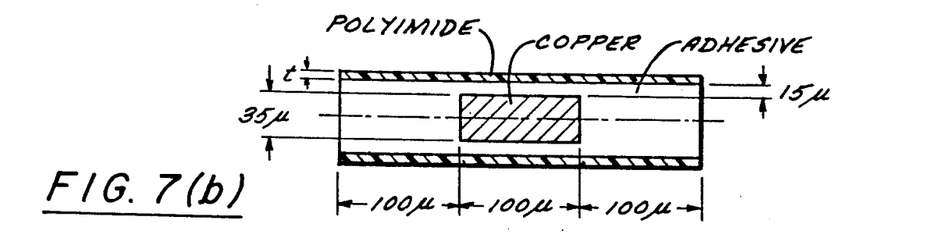
Figure 7C:
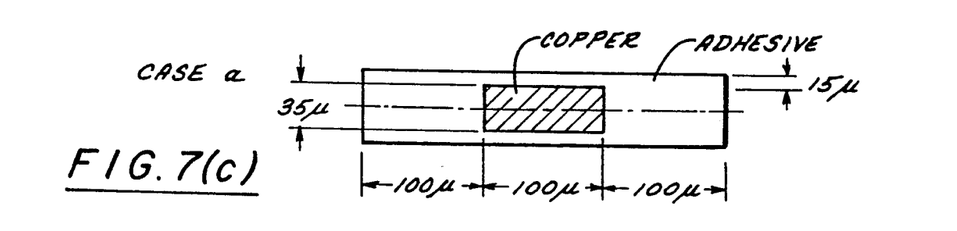
Figure 7D:
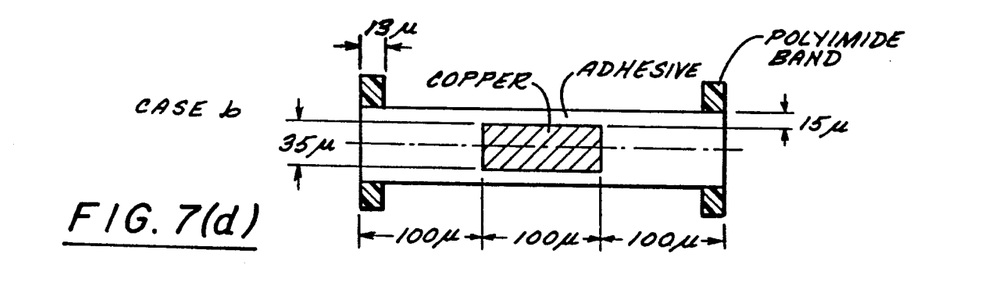
Figure 7E:
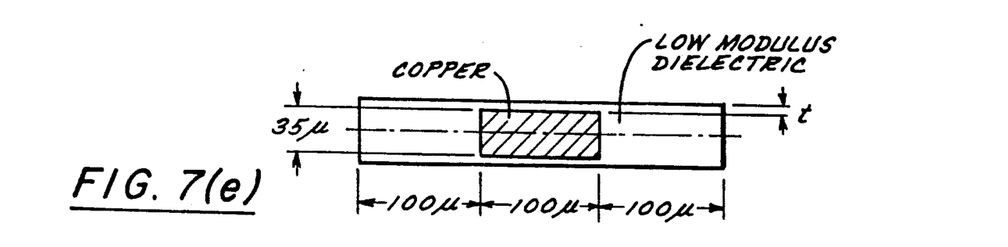

Table 1 shows a comparative analyses, based on a computer model, of the stiffness of various embodiments of the present invention as compared to a regular flexible circuit (i.e., without the designated flexing section of this invention) based on the beam analogy. To provide a meaningful comparison, the computer modeling was based, in all cases, on a "unit circuit" of a single copper conductor, duPont Kapton polyimide and/or Rogers 8970 adhesive. FIGS. 7(a)-7(e) show cross-sections of the several constructions analyzed in the study. FIGS. 7(a) shows a cross-section of a control unit circuit in accordance with the prior art (i.e., no designated flexing section according to this invention). FIG. 7(b) shows a unit circuit in accordance with the embodiment of FIG. 6, i.e., with thinned polyimide sections 26 and 28 in the designated flexing section. FIG. 7(c) shows a unit circuit in accordance with the embodiment of FIGS. 1 and 3, i.e., with full windows in the designated flexing section; FIG. 7(d) shows a unit circuit in accordance with the embodiment of FIGS. 4 and 5, i.e., with windows and edge strips in the designated flexing section; and FIG. 7(e) shows a unit circuit in accordance with the embodiment in which the polyimide and adhesive have been totally removed in the designated flexing section and replaced with the low elastic modulus material such as an elastomer with a low glass transition temperature, e.g., silicone rubber.

For the analyses of all of the unit circuits of FIGS. 7(a)-7(e), the following values were employed for moduli of elasticity of the various material components in the circuit (beam) cross section:

$$E_{dielectric} = 2.96 \times 10^9 Pa (0.43 \times 10^6 psi)$$

$$E_{copper} = 117 \times 10^9 Pa (17.0 \times 10^6 psi)$$

$$E_{adhesive} = 1.72 \times 10^9 Pa (0.25 \times 16^6 psi)$$

The stiffness value, EI, of the control circuit is presented as case 1 in Table 1.

Referring to the control unit circuit of FIG. 7(a), the following dimensions and other relevant data apply:

| copper line: | |
|---|---|
| width (w) | 100 micron (4 mil) |
| thickness (t) | 35 micron (1.4 mil) |
| dielectric | |
| width (w) | 300 micron (12 mil) |
| thickness (t) | 25 micron (1.0 mil) |
| adhesive | |
| width (w) | 300 micron (12 mil) |
| thickness (t) (between copper and dielectric) | 15 micron (0.6 mil) |

The control structure of FIG. 7(a) is an idealized cross section of a single circuit line flexible circuit made up of materials presently used for the manufacture of flexible circuits at Rogers Corporation, the assignee of this invention.

FIG. 7(b) shows a unit circuit made in accordance with the embodiment of FIG. 6, i.e., where the originally 25 micron (1.0 mil) dielectric has been thinned, as by laser ablation, in the designated flexing section. The analysis was performed for this unit circuit for three thicknesses of the dielectric:

$$t_1 = 5 \text{ micron (0.2 mil)}$$

$$t_2 = 10 \text{ micron (0.4 mil)}$$

$$t_3 = 15 \text{ micron (0.6 mil)}$$

All other dimensions of materials were the same as in the control unit circuit of FIG. 7(a). The absolute and relative stiffness (EI) for unit circuits of the three thicknesses are presented as cases 2, 3 and 4 in Table 1.

FIG. 7(c) shows a unit circuit made in accordance with the embodiment of FIGS. 1 and 3 where the dielectric is completely omitted or removed to form a window in the designated flexing section. FIG. 7(d) shows a unit circuit made in accordance with the embodiment of FIGS. 4 and 5 where dielectric edge strips (25 microns thick, 13 microns wide) are present in the window (top and bottom) in the designated flexing section. The absolute and relative stiffness are presented as cases 5 and 6 in Table 1.

FIG. 7(e) shows a unit circuit in which the dielectric and the adhesive have been completely removed in the designated flexing section and replaced with a low elastic modulus dielectric material (e.g., silicone rubber) which has a modulus of elasticity about one-tenth the modulus of the Rogers 8970 adhesive material, i.e., having an E=0.1 $E_{adhesive}$=1.72×10$^8$Pa (0.25×10$^5$psi). The analysis was performed for this unit circuit for three thicknesses t of the low modulus material above and below the copper line:

$t_1$ = 2 micron $t_2$ = 5 micron $t_3$ = 10 micron

The results are presented as cases 7, 8 and 9 in Table 1.

Comparison of the relative stiffness results shows that the construction of the embodiments of FIGS. 1, 3 (full open window, case 5) and 4, 5 (window with edge strips, case 6) reduced the stiffness to 37% and 42%, respectively, of the stiffness of the control (i.e., a reduction of 67% and 58%), and the construction of the embodiment of FIG. 6 (thinned dielectric, case 2) reduced the stiffness to 44% of the control (i.e., a reduction of 56%). These results clearly establish the effectiveness of these embodiments of the invention. These results are of particular interest and importance because the thickness dimensions of the materials used in the unit circuits of these embodiments reflect standard materials presently used at Rogers Corporation in production manufacture of flexible circuits. This means that the desired reduction in stiffness can be achieved while continuing to use the standard materials now used in production manufacture of printed circuits, and without having the change the basic manufacturing procedures now being used to make printed circuit materials. That means that the present invention can be implemented and its beneficial results can be obtained relatively economically.

Table 1 does show that cases 7, 8 and 9 realized even greater reduction in stiffness. However, that involves additional processing (laser removal of all dielectric and adhesive) and the introduction of a new material to the manufacturing process. From a cost/benefit analysis the constructions of FIGS. 1, 3 (case 5) FIGS. 4, 5 (case 6) and FIG. 6 (case 2) appear preferable. (The fact that all three cases (i.e., 7, 8 and 9) show the same reduction in stiffness despite different thickness of the low modulus material is a reflection of the fact that the modulus of the copper circuit line dominates the results in these cases.)

It should also be noted that the comparative analysis reflected in Table 1 was also run on constructions using thinner materials overall, i.e., thinner dielectric, copper and adhesive, and on constructions which eliminated the adhesive and used, instead, dielectric which bonded to the copper by adhesiveless bonding. Some of these constructions showed results less favorable than cases 2, 5 and 6, and some showed results more favorable. However, these constructions, which do not reflect the present invention because they do not have a designated flexing section of different construction than the remainder of the circuit, all involve the use of different materials, or at least different thickness dimensions, than are presently used in production manufacture of flexible circuits. Such materials are considerably more expensive than standard thickness materials, and will involve new problems in dealing with such thinner materials in production volume. The results obtained with these materials simply mean that the stiffness of a flexible circuit can be reduced by using thinner materials for the entire circuit (as distinguished from constructing a specific flexing section of reduced stiffness as in the present invention) if one is willing to endure the expense and problems associated with using thinner materials for the construction of the entire flexible circuit. Of course, with a flexible circuit constructed of thinner materials, the designated flexing section and the features and advantages of the present invention can be employed.

The construction of a flexible circuit in accordance with the present invention wherein the flexible circuit has a designated flexing section of reduced stiffness relative to the adjacent portions of the circuit alleviates the several problems of the prior art discussed above. Flexing is accommodated in a specific area of the circuit and the energy required to effect flexing is reduced. Specifically with regard to disc drives, the invention also contributes to reducing overshoot, ringing and access time in positioning the read/write head relative to the memory disc.

Figure 14:
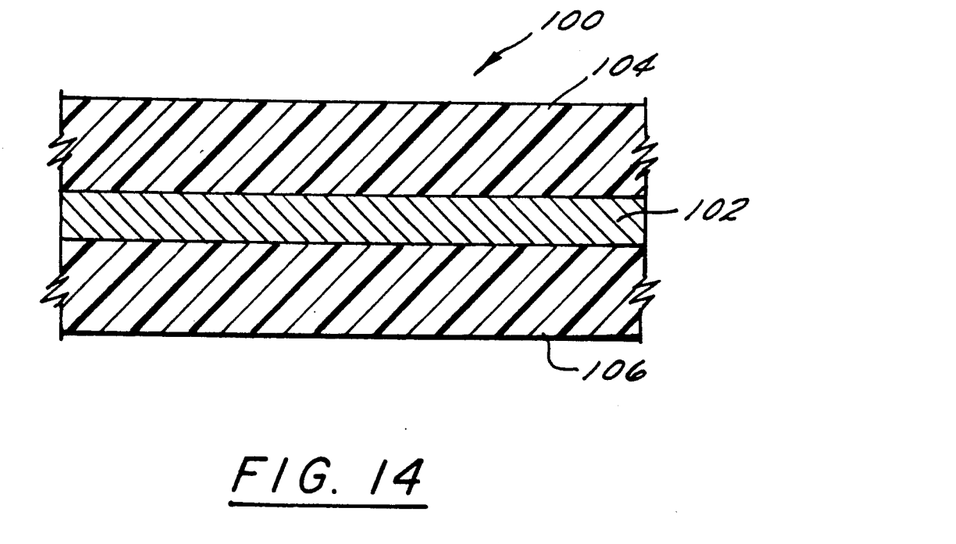
FIG. 14 is a cross-sectional elevation view of an adhesiveless circuit material.

The formation of a flexing section in accordance with the present invention may also be achieved with adhesiveless circuit materials as well as the conventional circuits of FIGS. 1–6 which include layers of adhesive. Referring to FIG. 14, an adhesiveless circuit is shown generally at 100. Circuit 100 has been made using well known adhesiveless circuit manufacturing techniques and comprises a pattern 102 (e.g. having a thickness of ½ to 2 ounce) of conductive material (e.g., copper) sandwiched between thicker layers 104, 106 (e.g., 1 mil) of dielectric material (e.g., polyimide). Known manufacturing techniques of use with the present invention include vapor deposition, sputtering, electroless plating followed by electroplating and using a film of conductive material (copper and other metals) onto which is cast a sheet of dielectric. In the embodiment of FIG. 14, the cover film 104 is also "adhesiveless" and is attached directly to trace 102 by casting or laminating. In the

TABLE 1

Comparison of Calculated Stiffness

| | | Layer Thickness (microns) | | | | | | | |
|---|---|---|---|---|---|---|---|---|---|
| Case | Construction | Bottom Kapton | Bottom Adhesive | Copper | Top Adhesive | Top Kapton | Bottom Other | Top Other | EI 10 (Nm) | Stiffness Relative to Control |
| 1 | Control (FIG. 7(a)) | 25 | 15 | 35 | 15 | 25 | | | 155.0 | 1.00 |
| 2 | FIG. 7(b) $t_1$ | 5 | 15 | 35 | 15 | 5 | | | 68.9 | 0.44 |
| 3 | FIG. 7(b) $t_2$ | 10 | 15 | 35 | 15 | 10 | | | 84.1 | 0.54 |
| 4 | FIG. 7(b) $t_3$ | 15 | 15 | 35 | 15 | 15 | | | 103.3 | 0.66 |
| 5 | FIG. 7(c) | 0 | 15 | 35 | 15 | 0 | | | 57.1 | 0.37 |
| 6 | FIG. 7(d) | 25* | 15 | 35 | 15 | 25 | | | 65.7 | 0.42 |
| 7 | FIG. 7(e) $t_1$ | / | / | 35 | / | / | 2 | 2 | 44.8 | 0.29 |
| 8 | FIG. 7(e) $t_2$ | / | / | 35 | / | / | 5 | 5 | 45.1 | 0.29 |
| 9 | FIG. 7(e) $t_3$ | / | / | 35 | / | / | 10 | 10 | 45.3 | 0.29 |

Figure 16:
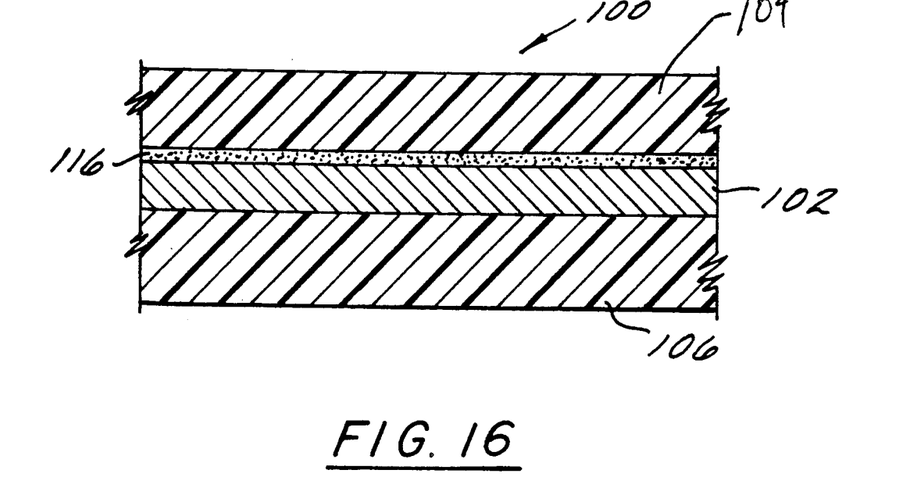
FIG. 16 is a cross-sectional elevation view of a second adhesiveless circuit material.
Figure 17:
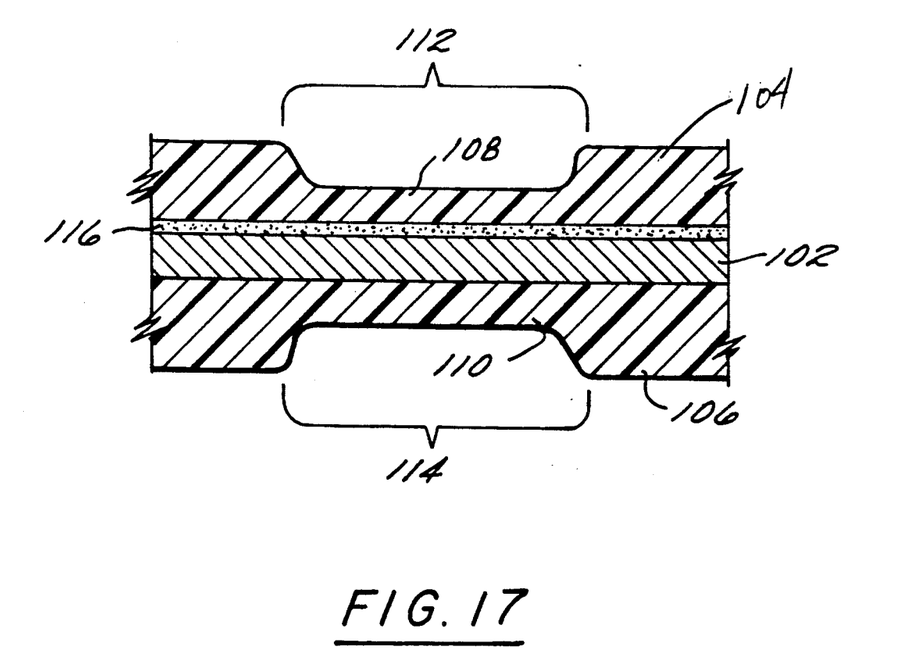
FIG. 17 is a cross-sectional elevation view of the adhesiveless circuit of FIG. 16 having selectively thinned flexible portions formed therein.

*bands 13 microns wide embodiment of FIG. 16, cover film 104 has been adhesively attached to circuit 102 by a layer of adhesive 116. However, the circuit of FIG. 16 (and 17) is still considered "adhesiveless" due to the absence of adhesive between circuit 102 and supporting dielectric 106.

Figure 15:
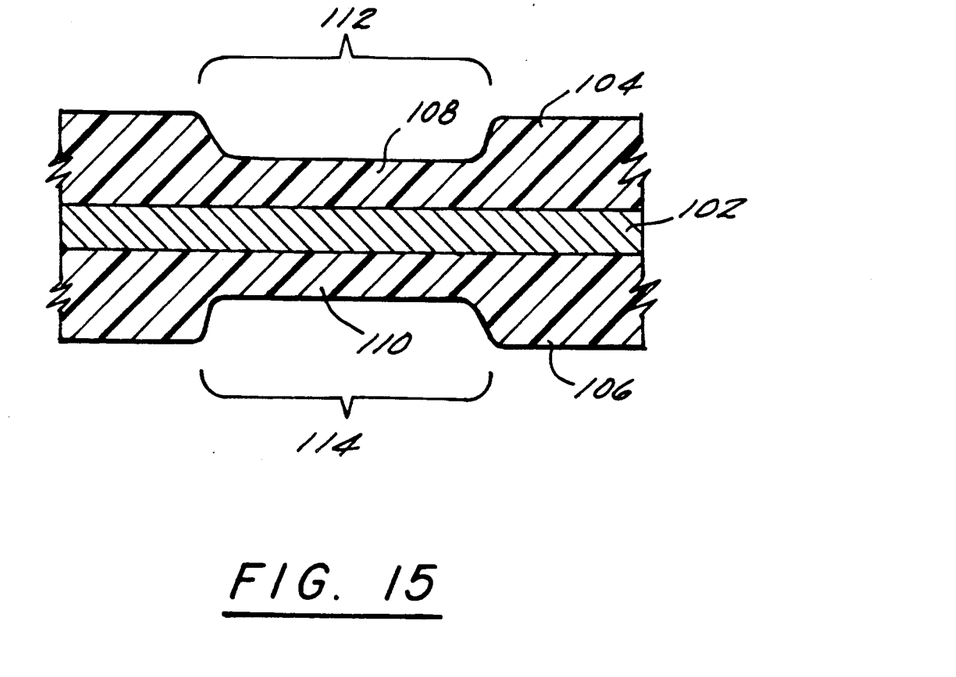
FIG. 15 is a cross-sectional elevation view of the adhesiveless circuit of FIG. 14 having selectively thinned flexible portions formed therein.

In FIGS. 15 and 17, and in accordance with the present invention, selectively thinned portions 108, 110 have been formed in layers 104, 106, respectively, to define a pair of opposed flexing sections 112, 114. Thinned portions 108, 110 may be formed using any of the methods (such as laser ablation) described above. It will be appreciated that the flexing sections 112, 114 for the adhesiveless circuit 100 may be configured in a manner similar to any of the several embodiments of flexing sections already described with reference to FIGS. 4, 5 and 8–11.

The thinning of an adhesiveless circuit material (FIGS. 15 and 17) is considered an important embodiment of this invention. Adhesiveless circuits with flexible sections of the type shown in FIGS. 15 and 17 provide even thinner, and more flexible circuits than the circuits of FIGS. 1–6 which include multiple adhesive layers. It will be appreciated that adhesiveless circuits are becoming increasingly important in the field of electronics and electronic components.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A flexible circuit having:
   a first layer of insulating material;
   a first layer of adhesive material bonded to said first layer of insulating material;
   at least one circuit line of a conductive material bonded to said first layer of adhesive material;
   a second layer of adhesive material bonded to said circuit line;
   a second layer of insulating material bonded to said second layer of adhesive; and
   a flexing section in the flexible circuit, the flexing section extending along a part of the length of the flexible circuit, said flexing section being formed by selectively and symmetrically removing at least part of the first and second layers of insulating materials in an amount effective to provide said flexing section with a stiffness less than sections of the flexible circuit adjacent to said flexing section, the first and second layers of insulating materials both having non-uniform dielectric thicknesses with respect to the length of the flexible circuit.

2. A flexible circuit as in claim 1 wherein:
   the moment of inertia of said flexing section is less than the moment of inertia of sections of the flexible circuit adjacent to said flexing section such that the energy required to flex said flexing section is reduced relative to the energy required to flex the sections of the flexible circuit adjacent to said flexing section.

3. A flexible circuit as in claim 1 wherein:
   said flexing section is defined by first and second opposed windows in each of said first and second layers of insulating material.

4. A flexible circuit as in claim 3 wherein:
   said opposed windows are entirely devoid of said first and second insulating materials.

5. A flexible circuit as in claim 3 wherein said flexing section includes:
   edge strips of said first insulating material bonded to said first layer of adhesive and extending across said first window along the edges of a first surface of the flexible circuit; and
   edge strips of said second insulating material bonded to said second layer of adhesive and extending along the edges of a second surface of the flexible circuit.

6. A flexible circuit as in claim 3 wherein:
   said flexing section is symmetric about said circuit line.

7. A flexible circuit as in claim 3 wherein:
   said windows are devoid of said first and second insulating materials and said first and second adhesive materials, and said windows include a material surrounding said circuit line which has a lower elastic modulus than sections of the flexible circuit adjacent to said flexing section such that the energy required to flex said flexing section is reduced relative to the energy required to flex the sections of the flexible circuit adjacent to said flexing section.

8. A flexible circuit as in claim 1 wherein said flexing section includes:
   opposed lengths of said first and second insulating materials having at least one channel formed therein to define a hinge.

9. A flexible circuit of claim 8 including:
   a plurality of spaced channels.

10. A flexible circuit of claim 9 including:
    variable spacing between at least some of said spaced channels.

11. A flexible circuit of claim 8 wherein:
    said at least one channel has a "U" or "V" shaped cross-section.

12. A flexible circuit of claim 11 wherein:
    said at least one channel has a flattened "U" or "V" shaped cross-section for reducing stress concentration.

13. A flexible circuit having:
    a laminate construction of a plurality of circuit lines in the center of the thickness of the flexible circuit, opposed first and second layers of adhesive bonded to opposite sides of said circuit lines, and opposed first and second layers of dielectric material on the sides thereof removed from said circuit lines; and
    a flexing section in the flexible circuit and extending along a part of the length of the flexible circuit, said flexing section being thinner relative to the thicknesses of sections of the flexible circuit adjacent to the flexing section and having a moment of inertia less than the moment of inertia of the remainder of the flexible circuit such that the energy required to flex said flexing section is reduced relative to the energy required to flex the sections of the flexible circuit adjacent to said flexing section, said flexing section being formed by selectively and symmetrically removing at least part of the first and second layers of insulating materials, the first and second layers of insulating materials both having non-uniform dielectric thicknesses with respect to the length of the flexible circuit.

14. A flexible circuit as in claim 13 wherein:
    said flexing section is defined by first and second opposed windows in each of said first and second layers of insulating material.

15. A flexible circuit as in claim 14 wherein:

said opposed windows are entirely devoid of said first and second insulating materials.

16. A flexible circuit as in claim 14 wherein said flexing section includes:
edge strips of said first insulating material bonded to said first layer of adhesive and extending across said first window along the edges of a first surface of the flexible circuit; and
edge strips of said second insulating material bonded to said second layer of adhesive and extending along the edges of a second surface of the flexible circuit.

17. A flexible circuit as in claim 13 wherein:
said flexing section is symmetric about said circuit lines.

18. A flexible circuit as in claim 6 wherein:
said windows are devoid of said first and second insulating materials and said first and second adhesive materials, and include a material surrounding said circuit lines which has a lower elastic modulus than sections of the flexible circuit adjacent to said flexing section such that the energy required to flex said flexing section is reduced relative to the energy required to flex the sections of the flexible circuit adjacent to said flexing section.

19. A flexible circuit as in claim 13 wherein said flexing section includes:
opposed lengths of said first and second insulating materials having at least one channel formed therein to define a hinge.

20. A flexible circuit of claim 13 including:
a plurality of spaced channels.

21. A flexible circuit of claim 20 including:
variable spacing between at least some of said spaced channels.

22. A flexible circuit of claim 13 wherein:
said at least one channel has a "U" or "V" shaped cross-section.

23. A flexible circuit of claim 22 wherein:
said at least one channel has a flattened "U" or "V" shaped cross-section for reducing stress concentration.

24. A flexible circuit having:
a first layer of insulating material;
a second layer of insulating material;
at least one circuit line of a conductive material sandwiched between said first and second layers of insulating material; and
a flexing section in the flexible circuit, the flexing section extending along a part of the length of the flexible circuit, said flexing section being formed by selectively and symmetrically removing at least part of the first and second layers of insulating materials in an amount effective to provide said flexing section with a stiffness less than sections of the flexible circuit adjacent to said flexing section, the first and second layers of insulating materials both having non-uniform dielectric thicknesses with respect to the length of the flexible circuit.

25. A flexible circuit as in claim 24 wherein:
the moment of inertia of said flexing section is less than the moment of inertia of sections of the flexible circuit adjacent to said flexing section such that the energy required to flex said flexing section is reduced relative to the energy required to flex the sections of the flexible circuit adjacent to said flexing section.

26. A flexible circuit as in claim 24 wherein:
said flexing section is defined by first and second opposed windows in each of said first and second layers of insulating material.

27. A flexible circuit as in claim 26 wherein:
said flexing section is symmetric about said circuit line.

28. A flexible circuit as in claim 26 wherein:
said windows are devoid of said first and second insulating materials and said first and second adhesive materials, and said windows include a material surrounding said circuit line which has a lower elastic modulus than sections of the flexible circuit adjacent to said flexing section such that the energy required to flex said flexing section is reduced relative to the energy required to flex the sections of the flexible circuit adjacent to said flexing section.

29. A flexible circuit as in claim 24 wherein said flexing section includes:
opposed lengths of said first and second insulating materials having at least one channel formed therein to define a hinge.

30. A flexible circuit of claim 29 including:
a plurality of spaced channels.

31. A flexible circuit of claim 30 including:
variable spacing between at least some of said spaced channels.

32. A flexible circuit of claim 29 wherein:
said at least one channel has a "U" or "V" shaped cross-section.

33. A flexible circuit of claim 32 wherein:
said at least one channel has a flattened "U" or "V" shaped cross-section for reducing stress concentration.

34. A flexible circuit of claim 24 wherein:
said circuit line is directly bonded to both said first and second layers of insulating material.

35. A flexible circuit of claim 24 including:
a layer of adhesive material between said circuit line and said second layer of insulating material.

36. A flexible circuit having:
a laminate construction of a plurality of circuit lines in the center of the thickness of the flexible circuit, and opposed first and second layers of dielectric material on opposed sides of said circuit lines;
with at least said first layer of dielectric material being bonded to said circuit lines; and
a flexing section in the flexible circuit and extending along a part of the length of the flexible circuit, said flexing section being thinner relative to the thicknesses of sections of the flexible circuit adjacent to the flexing section and having a moment of inertia less than the moment of inertia of the remaining of the flexible circuit such that the energy required to flex said flexing section is reduced relative to the energy required to flex the sections of the flexible circuit adjacent to said flexing section, said flexing section being formed by selectively and symmetrically removing at least part of the first and second layers of insulating materials, the first and second layers of insulating materials both having non-uniform dielectric thicknesses with respect to the length of the flexible circuit.

37. A flexible circuit as in claim 36 wherein:
said flexing section is defined by first and second opposed windows in each of said first and second layers of insulating material.

38. A flexible circuit as in claim 36 wherein:

said flexing section is symmetric about said circuit lines.

39. A flexible circuit as in claim 37 wherein:

said windows are devoid of said first and second insulating materials and said first and second adhesive materials, and said windows include a material surrounding said circuit line which has a lower elastic modulus than sections of the flexible circuit adjacent to said flexing section such that the energy required to flex said flexing section is reduced relative to the energy required to flex the sections of the flexible circuit adjacent to said flexing section.

40. A flexible circuit of claim 36 wherein:

said circuit line is directly bonded to both said first and second layers of insulating material.

41. A flexible circuit of claim 36 including:

a layer of adhesive material between said circuit line and said second layer of insulating material.

42. A flexible circuit as in claim 1 wherein said flexing section includes:

only a part of said first and second layer of insulating materials being removed.

43. A flexible circuit as in claim 13 wherein said flexing section includes:

only a part of said first and second layer of insulating materials being removed.

44. A flexible circuit as in claim 24 wherein said flexing section includes:

only a part of said first and second layer of insulating materials being removed.

45. A flexible circuit as in claim 36 wherein said flexing section includes:

only a part of said first and second layer of insulating materials being removed.

* * * * *